(12) United States Patent
Park (10) Patent No.: US 11,985,771 B2
(45) Date of Patent: May 14, 2024

(54) AIR BAG CONTROL UNIT

(71) Applicant: HYUNDAI MOBIS CO., LTD., Seoul (KR)

(72) Inventor: Jeong Gyun Park, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 490 days.

(21) Appl. No.: 17/325,559

(22) Filed: May 20, 2021

(65) Prior Publication Data

US 2021/0378108 A1 Dec. 2, 2021

(30) Foreign Application Priority Data

Jun. 2, 2020 (KR) .................. 10-2020-0066641
Jun. 25, 2020 (KR) .................. 10-2020-0077620

(51) Int. Cl.
*H05K 5/00* (2006.01)
*B60R 21/01* (2006.01)
*H05K 5/06* (2006.01)
*H05K 1/18* (2006.01)

(52) U.S. Cl.
CPC ............ *H05K 5/006* (2013.01); *B60R 21/01* (2013.01); *H05K 5/0056* (2013.01); *H05K 5/0069* (2013.01); *H05K 5/066* (2013.01); *H05K 1/18* (2013.01); *H05K 2201/10015* (2013.01); *H05K 2201/10151* (2013.01); *H05K 2201/10189* (2013.01); *H05K 2201/105* (2013.01)

(58) Field of Classification Search
CPC .... H05K 5/006; H05K 5/0056; H05K 5/0069; H05K 5/066; H05K 1/18; H05K 2201/10015; H05K 2201/10151; H05K 2201/10189; H05K 2201/105; H05K 5/0078; B60R 21/01; B60R 16/0239; B60R 2021/01286

See application file for complete search history.

(56) References Cited

U.S. PATENT DOCUMENTS

| | | | | |
|---|---|---|---|---|
| 2003/0199195 A1* | 10/2003 | Koehler | ............... | H01R 12/724 439/541.5 |
| 2007/0049121 A1* | 3/2007 | Steele | ................... | H05K 5/064 439/630 |
| 2011/0180318 A1* | 7/2011 | Yamada | ................ | H05K 7/026 174/559 |
| 2019/0306998 A1* | 10/2019 | Malecke | ............. | H01R 13/518 |

FOREIGN PATENT DOCUMENTS

| KR | 102007005437 A | 5/2007 |
|---|---|---|
| KR | 1020070054376 A | 5/2007 |

* cited by examiner

*Primary Examiner* — Michael C Zarroli
(74) *Attorney, Agent, or Firm* — Novo TechIP International PLLC (57) ABSTRACT

The present invention relates to an airbag control unit including a housing that forms an enclosure and has an opening at an end thereof; a PCB that is coupled to the housing by coupling to a corner portion in the opening and an electrical connection structure in which a terminal pin is inserted into a terminal pin hole; and a cover provided in a shape covering the opening and includes an edge joined and fixed along an edge of the opening.

12 Claims, 12 Drawing Sheets

AIR BAG CONTROL UNIT

CROSS REFERENCE TO RELATED APPLICATION

The present application claims priority to Korean Patent Application Nos. 10-2020-0066641, filed on Jun. 2, 2020 and 10-2020-0077620, filed on Jun. 25, 2021, the entire contents of which is incorporated herein for all purposes by this reference.

BACKGROUND OF THE INVENTION

Field of the Invention

The present invention relates to an airbag control unit capable of improving waterproof performance while formed being slim by improving a coupling structure between parts of the airbag control unit.

Description of the Related Art

In a conventional airbag control unit, a mounting part mounted on a vehicle is formed of a metal material to conduct electrical conduction, thereby increasing electrical stability by connecting an electrical ground to a vehicle chassis.

Meanwhile, recently, in order to reduce the weight and cost of the airbag control unit, the material of a housing is changed to a plastic material, and a cover is made of a steel material to be electrically connected to a PCB circuit.

However, there is a problem in that the housing and the cover are made of different materials and are vulnerable to moisture inflow. Accordingly, in order to prevent moisture from flowing into the airbag control unit, a space for preventing moisture inflow is secured in the housing, but this causes a problem in that the height of the control unit is increased.

That is, the airbag control unit is mounted on the lower part of a console part, which is the center of a vehicle, because it is equipped with a sensor that detects the vehicle's rolling, yaw, pitch, and acceleration in the X, Y, and Z axes.

However, since the console part disappears from the interior of the flatform of an autonomous driving vehicle and an electric vehicle and the interior becomes flat, a waterproof structure capable of completely blocking the inflow of moisture while slimming the airbag control unit is required.

Further, the conventional airbag control unit has a problem in that the wires connected to the airbag control unit are bent because the wiring is branched to the front and rear of the vehicle in one direction.

In addition, since a heavy wiring harness is connected only in one direction of the airbag control unit, there is a problem in that a load is concentrated in only one direction of the airbag control unit, thereby exerting excessive stress on the airbag control unit.

In other words, the main sensors for detecting the behavior of the vehicle are built in the airbag control unit, and these sensors are fixed to the PCB of the control unit. Since the terminal pin of the connector is coupled to only one side of the PCB, the stress applied to the sensor by the combination of the terminal pin is biased to one side, resulting in an unstable function of the sensor.

The matters described as the background art are only for enhancing an understanding of the background of the present invention, and should not be taken as acknowledging that they correspond to the prior art already known to those of ordinary skill in the art.

SUMMARY OF THE INVENTION

The present invention has been conceived to solve the above-described problems, and is to provide an airbag control unit that can improve waterproof performance while forming being slimmer by improving a coupling structure between parts for assembling an airbag control unit.

Another object of the present invention is to provide an airbag control unit that can prevent stress from being concentrated in the control unit while preventing bending of a wiring harness by distributing connectors on both sides of a housing.

The configuration of the present invention in order to achieve the above purpose may include a housing that is in an enclosure shape and includes an opening formed at an end thereof; a PCB that is coupled to the housing by coupling to a corner portion in the opening and an electrical connection structure in which a terminal pin is inserted into a terminal pin hole so that it is energized; and a cover that is provided in a shape covering the opening and includes an edge joined and fixed along an edge of the opening.

A coupling protrusion may be formed protruding at a corner portion in the opening; and a through-hole may be formed in a corner portion of the PCB, and the coupling protrusion may be inserted into and coupled to the through-hole.

A boss may be formed in a corner portion of the cover; and an end of the coupling protrusion may be inserted into and joined to the boss.

The housing and the cover may be made of a plastic material, and a laser may be irradiated to the coupling protrusion while penetrating the cover, so that the coupling protrusion and the boss may be laser-welded.

The housing and the cover may be formed of a plastic material, and a laser may be irradiated to an edge of the opening of the housing while penetrating the cover, so that the edge of the opening of the housing and the edge of the cover may be laser-welded.

The terminal pin may be provided inside the housing toward the cover; and a terminal pin hole may be formed at a location of the PCB corresponding to the terminal pin, and the terminal pin may be inserted.

One connector and the other connector may be formed on both sides of the housing, respectively; the PCB may be provided inside the housing; and one terminal pin and the other terminal pin respectively coupled to both sides of the PCB may be formed to face the one connector and the other connector.

The one terminal pin and the other terminal pin may be symmetrically coupled to both sides based on a virtual center line formed in a center of the PCB.

The one terminal pin and the other terminal pin may be disposed along both edges inside the housing.

The one terminal pin and the other terminal pin may be disposed symmetrically along both edges inside the housing.

A sensor unit may be mounted between the one terminal pin and the other terminal pin.

One end of the terminal pin may be penetrated and coupled in a direction perpendicular to a plane of the PCB; and a middle portion of the terminal pin may be bent toward a fastener of the connector, and the other end of the terminal pin may be located inside the connector.

The terminal pin may be formed to be bent in a shape of 'L', and the other end of one terminal pin and the other end of the other terminal pin may be provided in opposite directions.

The terminal pins may be arranged in a plurality of rows and penetrated a pin alignment bracket in a plate shape; and the pin alignment bracket may be fixed to an inner surface of the housing, and the terminal pin may be inserted into and coupled to the terminal pin hole formed on the PCB in the process that the PCB is coupled to the housing.

A capacitor in a cylindrical shape may be laid down inside the housing; and a hook may be formed on a bottom surface of the housing in a shape surrounding an outer circumferential surface of the capacitor, and the capacitor may be fastened by the hook.

A lead pin may be connected to be energized to an end of the capacitor; and a holder pin may be connected to be energized between the lead pin and the PCB.

A lower portion of the holder pin may be divided into a V shape to form a pin leg, and an end of the pin leg may be coupled to the bottom surface of the housing; a lead pin groove may be formed between the pin legs so that the lead pin may be inserted so as to be energized; a pin head may be formed protruding on an upper portion of the holder pin; and a holder pin hole may be formed on the PCB corresponding to the pin head so that the pin head may be connected to be energized.

In the present invention, in order to solve the above problems, a housing and a PCB are coupled in a double fixing method by a terminal pins and welding joint, and the housing and the cover made of plastic material are integrated and combined by welding joint. Accordingly, there are effects of implementing excellent waterproof performance while manufacturing the control unit to be slim, and reducing cost and weight by reducing parts for coupling of the control unit.

In addition, since connectors are disposed in both directions of the housing, and the terminal pins are coupled to the positions of the PCB facing each connector, there is an effect of preventing the wire branching from the airbag control unit from being bent.

In addition, since a wiring harness structure is optimized, the force applied to the airbag control unit is distributed to prevent a load from being concentrated on the airbag control unit. Thus, there is an effect of stabilizing the sensing function by not applying excessive stress to the airbag control unit and internal sensors.

DETAILED DESCRIPTION OF THE INVENTION

The preferred embodiments of the present invention will be described in detail with reference to the accompanying drawings.

Figure 1:
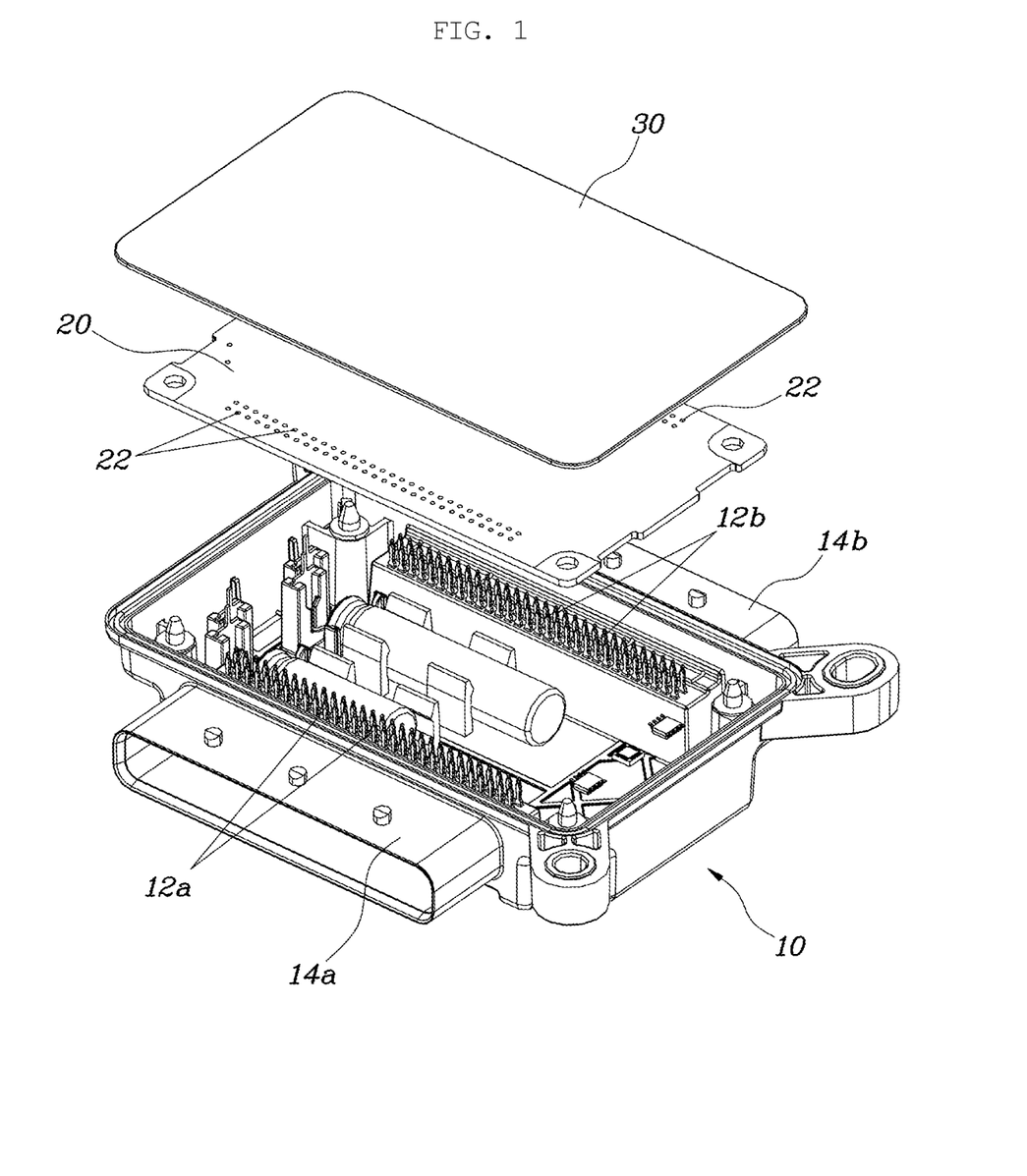
FIG. 1 is an exploded perspective view of an airbag control unit according to the present invention as viewed from a cover direction.
Figure 2:
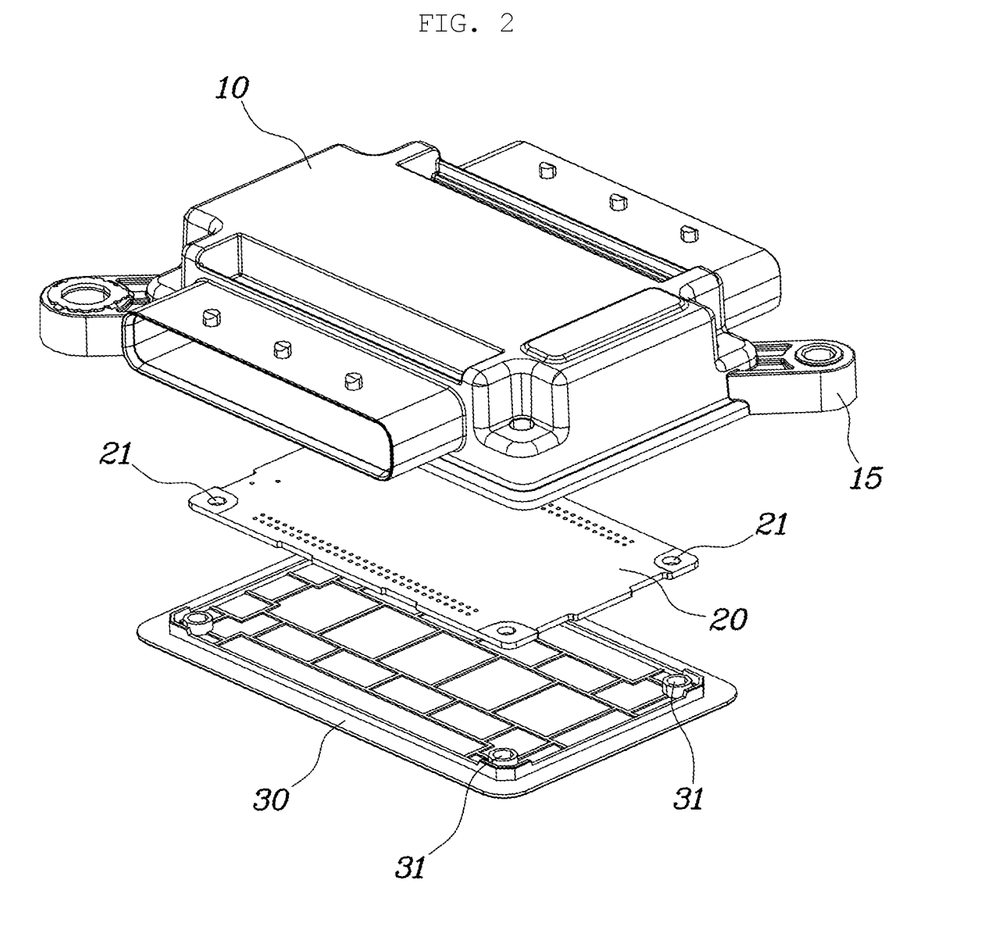
FIG. 2 is an exploded perspective view of an airbag control unit according to the present invention as viewed from a housing direction.

FIG. 1 is an exploded perspective view of an airbag control unit according to the present invention as viewed from a cover 30 direction, and FIG. 2 is an exploded perspective view of an airbag control unit according to the present invention viewed from a housing 10 direction.

The airbag control unit of the present invention largely includes a housing 10, a PCB 20 and a cover 30, and includes a housing in an enclosure shape and having an opening at an end; a PCB coupled to the housing by coupling to a corner portion in the opening and an electrical connection structure in which a terminal pin is connected to a terminal pin hole to be energized; and a cover provided in a shape covering the opening and having an edge joined and fixed along an edge of the opening.

Referring to the FIGS., the present invention is described in detail. First, the housing 10 is formed in the shape of a rectangular enclosure in which an opening 10*a* is formed at an end thereof.

The housing 10 is formed of a plastic material, and a bushing 15 is formed by insert-injecting at an outer corner portion. A ground ring is provided on the bushing 15 to connect an electrical ground to a vehicle chassis.

The PCB 20 is composed of a sensor unit 24 required for airbag deployment and logic ICs as an electrical circuit, and is formed in a rectangular plate shape.

The PCB 20 is configured to be coupled to the housing 10 by entering and coupling the four corner portions to the four corner portions of the inside of the opening 10*a*, and by the electrical connection structure in which a terminal pin 12 is inserted into a terminal pin hole 22 to be energized.

The cover 30 is injection-molded of a plastic material, and is formed in a rectangular plate shape covering the opening 10*a* together with the PCB 20 to protect the PCB 20. For reference, a grid-shaped rib (reference sign omitted) is formed on the inner surface of the cover 30 facing the PCB 20, so that the rigidity of the cover 30 may be reinforced.

In this way, the cover 30 has a structure in which the rim is joined and fixed along the rim of the opening 10*a*.

For example, the housing 10 and the PCB 20 are coupled by a fixing method in which each corner is joined and a fixing method in which the terminal pin 12 is inserted into the terminal pin hole 22. Thus, the coupling of the housing 10 and the PCB 20 is made firmly and stably.

In addition, the housing 10 and the cover 30 are joined and fixed along their edges, thereby completely blocking the inflow of moisture into the control unit to implement a completely waterproof structure of the control unit, thereby safely protecting the PCB 20.

Since the present invention is manufactured by integrating the exterior of the airbag control unit with a plastic material, the control unit, compared to one manufactured by the existing screw and bolt fastening methods, can achieve excellent waterproof performance while being slimer and reduce the cost and weight by reducing parts.

Figure 3:
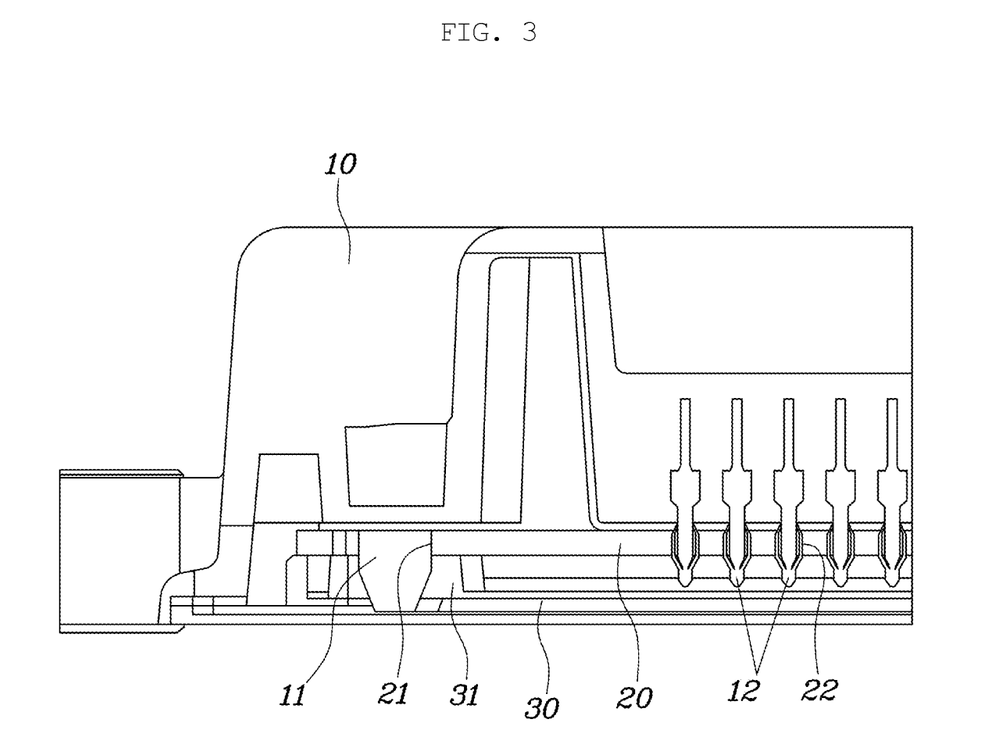
FIG. 3 is a view showing a configuration in which a coupling protrusion is inserted into a through-hole and coupled to a boss, and a terminal pin is coupled to a terminal pin hole, according to the present invention.

Referring to FIGS. 1 to 3, in the present invention, coupling protrusions 11 are formed at the four corner portions in the opening 10a, respectively. The coupling protrusion 11 may be formed in a conical shape whose end is pointed toward the cover 30.

In addition, through-holes 21 having a circular shape are formed at four corners of the PCB 20, respectively, so that the coupling protrusions 11 are inserted into the through-holes 21.

Further, bosses 31 having a groove shape in a center is formed at the four corner portions of the cover 30, and the conical shape of the coupling protrusion 11 may be joined and inserted into the boss 31.

That is, in a state in which the middle end portion of the coupling protrusion 11 is inserted into the through-hole 21 of the PCB 20, the end of the coupling protrusion 11 is inserted and fixed into the groove in the center of the boss 31. Accordingly, it is possible to maintain a solid coupling relationship between the housing 10, and the PCB 20 and the cover 30.

In particular, in the present invention, the housing and cover are formed of a plastic material, and a laser is irradiated to the coupling protrusion 11 while passing through the cover 30, so that the coupling protrusion 11 and the boss 31 are joined by laser welding.

To this end, the cover 30 is formed in a white color, which is a relatively bright color, to form a transmission layer through which the laser is transmitted, whereas the housing 10 is formed in a black color, which is a relatively dark color, to form an absorbing layer in which the laser is absorbed.

That is, if the laser is irradiated on the coupling protrusion 11 in the state in which the PCB 20 and the cover 30 are coupled to the housing 10, the laser penetrates the cover 30 to melt the coupling protrusion 11. Then, the melted coupling protrusion 11 is fused to the boss 31 while being pressed into the boss 31 of the cover 30, so that the housing 10 can be firmly welded to the PCB 20 and the cover 30.

Further, in the present invention, the housing and the cover are formed of a plastic material, and the laser is irradiated to the edge of the opening 10a of the housing 10 while passing through the cover 30, and the edge of the opening 10a of the housing 10 and the edges of the cover 30 are joined by laser welding.

To this end, as described above, the cover 30 is formed in a white color, which is a relatively bright color, to form a transmission layer through which the laser is transmitted, while the housing 10 is black, which is a relatively dark color, to form an absorption layer in which the laser is absorbed.

That is, if a laser is irradiated on the edge of the opening 10a of the housing 10 in a state in which the PCB 20 and the cover 30 are coupled to the housing 10, the laser passes through the cover 30 and melts the edge of the opening 10a, and the edge portion of the cover 30 is pressed and fused to the melted edge portion. Thus, all the outer peripheries of the opening 10a of the housing 10 can be securely welded together by the cover 30.

Meanwhile, in the present invention, the terminal pin 12 is provided inside the housing 10 toward the cover 30, and the terminal pins 12 are arranged in a plurality of rows in a direction perpendicular to the plane of the PCB 20. For reference, the terminal pin 12 may be provided by insert injection into the housing 10.

In addition, a plurality of terminal pin holes 22 is formed at positions of the PCB 20 corresponding to the terminal pins 12, so that the terminal pins 12 are inserted into the terminal pin holes 22, respectively.

For example, the terminal pin hole 22 may be formed in a square shape, and the terminal pin 12 has a structure in which the middle end is formed wider than the cross-sectional area of the terminal pin hole 22 and is elastically compressed and deformable.

Therefore, if the middle end of the terminal pin 12 is press-inserted into the inner surface of the terminal pin hole 22, the middle end of the terminal pin 12 is inserted in a close contact with the terminal pin hole 22. Thus, the housing 10 and the PCB 20 are coupled in an energized state, and after the terminal pin 12 is inserted, it is not removed from the terminal pin hole 22 due to the elastic restoring force of the terminal pin 12.

In addition, as shown in FIG. 1, the present invention is formed with one connector and the other connector on both sides of the housing, respectively; the PCB is provided inside the housing; one terminal pin and the other terminal pin coupled to both sides of the PCB may be formed to face one connector and the other connector.

Referring to the drawings, one connector 14a and the other connector 14b formed on both sides of the housing 10 are formed by insert injection in the housing 10, and the PCB 20 is coupled to the inside of the housing 10.

In addition, one terminal pin 12a and the other terminal pin 12b are respectively coupled to both sides of the PCB 20, so that the one terminal pin 12a and the other terminal pin 12b are respectively configured to positioned toward the one connector 14a on the other connector 14b.

That is, the connectors 14 are arranged in both directions of the housing 10, respectively, and the terminal pins 12 are coupled to the positions of the PCB 20 facing each connector 14. Accordingly, the wire branching from the airbag control unit is prevented from being bent.

Thus, the wiring harness structure is optimized to distribute the force applied to the airbag control unit, thereby preventing the load from being concentrated on the airbag control unit. Accordingly, excessive stress is not applied to the airbag control unit and the sensing function can be stabilized.

Figure 12:
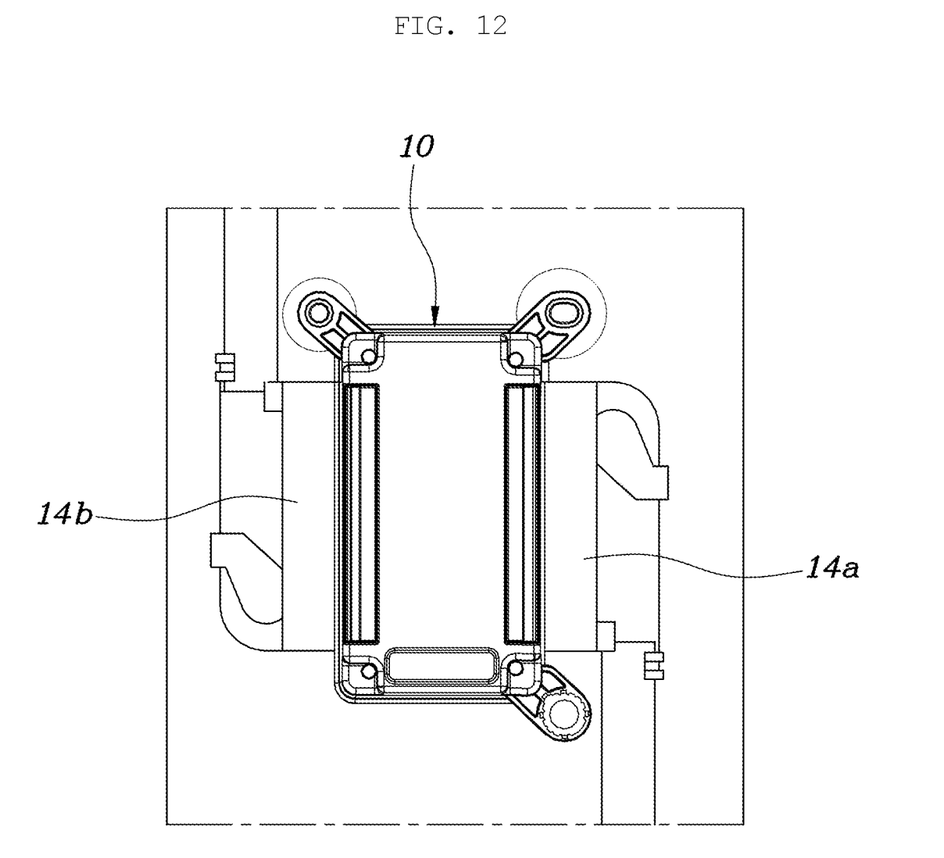
FIG. 12 is a view illustrating a configuration in which a wire is branched from both sides of a housing according to the present invention.

FIG. 12 is a view illustrating a configuration in which a wire is branched from both sides of the housing 10 of the present invention. Referring to the drawings, the present invention arranges one connector 14a and the other connector 14b on both sides of the housing 10. Thus, it is possible to optimize the route of the wiring harness, thereby preventing the wire from being bent, and preventing damage and breakage of the wire.

In addition, by arranging the connector 14 on both sides of the housing 10, the connector 14 can be positioned not only in the left and right directions of the vehicle, but also in the front and rear directions, thereby efficiently changing the wiring route according to the vehicle structure.

Figure 7:
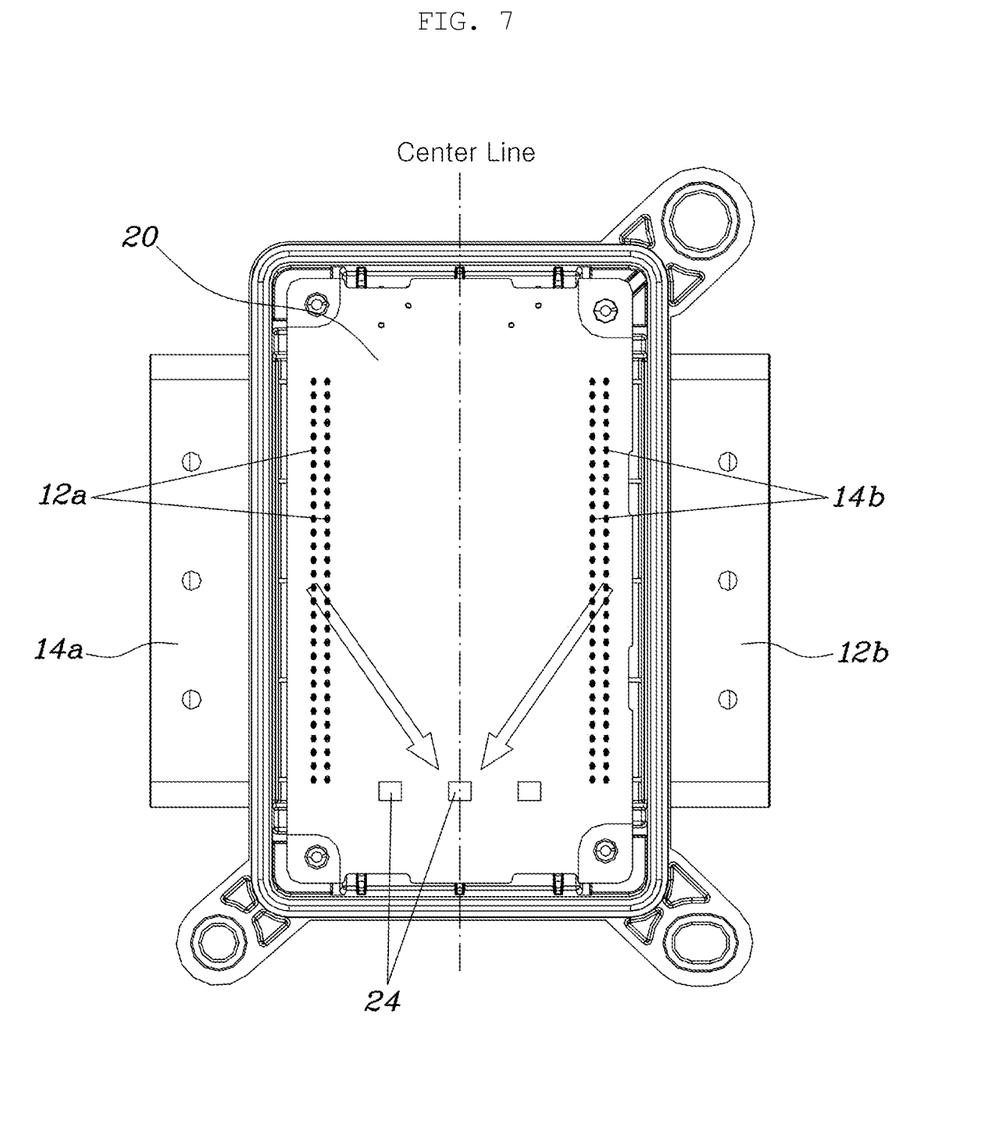
FIG. 7 is a view showing a configuration in which a terminal pin is symmetrically coupled to both sides of a PCB according to the present invention.

Meanwhile, FIG. 7 is a view showing a configuration in which the terminal pins 12 are symmetrically coupled to both sides of the PCB 20 according to the present invention.

Referring to the drawings, the one terminal pin 12a and the other terminal pin 12b are symmetrically coupled to both sides based on a virtual center line formed in the center of the PCB 20.

In addition, the sensor unit 24 may be mounted between the one terminal pin 12a and the other terminal pin 12b.

Specifically, since the one terminal pin 12a and the other terminal pin 12b are arranged symmetrically along both edges inside the housing 10, the terminal pins 12 are respectively provided along one edge located in the length direction of the longer side of the four edges of the housing 10 and the other side edge facing the one edge.

In addition, the terminal pins 12 are provided at one side edge and the other side edge based on a virtual center line formed along the length direction of the longer side of the housing 10.

According to the arrangement of the terminal pins 12, in the present invention, the connectors 14 are disposed on both sides of the housing 10, and the terminal pins 12 are disposed on each connector 14. In addition, various sensors are coupled to the center of the PCB 20.

Thus, since the terminal pins 12, in the present invention, are arranged to the left and right of the PCB 20, the pressure applied to the PCB 20 by the coupling of the terminal pins 12 is uniformly distributed to both sides. Thus, the stress applied to the sensor unit 24 is distributed in a balanced manner, and the sensing function is stably maintained by strongly resisting the external force applied to the sensor unit 24.

In addition, in the case of a structure in which the connectors 14 are formed one on both sides, the height can be reduced compared to the housing 10 in which the two connectors 14 are formed in the vertical direction, so that the airbag control unit can be manufactured slim.

Figure 8:
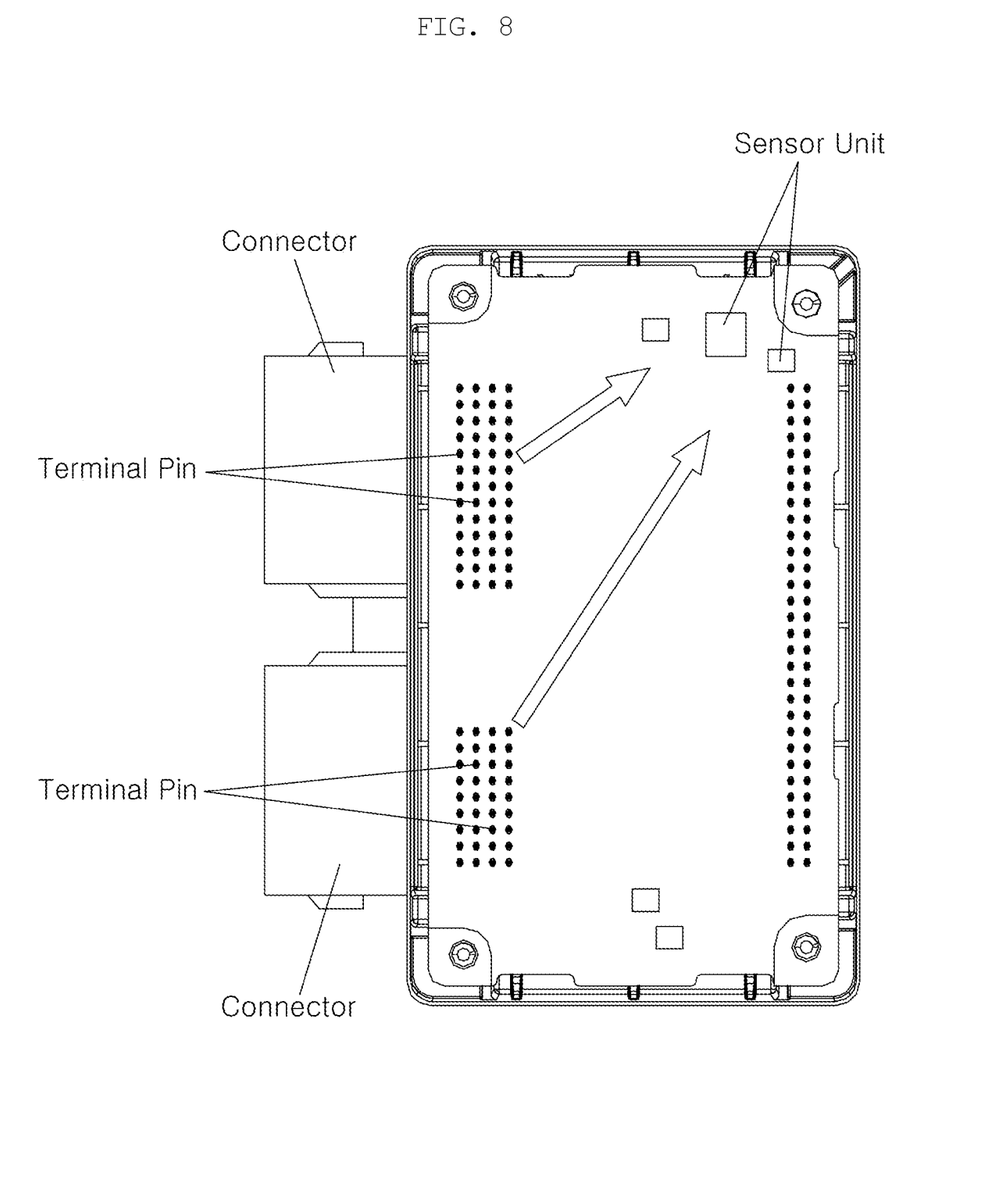
FIG. 8 is a view showing a configuration in which a connector and a terminal pin are installed in a conventional airbag control unit.

For reference, FIG. 8 is a view showing a configuration in which the connector 14 and the terminal pin 12 are installed in a conventional airbag control unit. Here, since the terminal pin 12 is installed in one direction of the PCB 20, the stress applied to the sensor unit 24 is concentrated on one side so that an imbalance is formed, and thus the function of the sensor unit 24 becomes unstable, which can be solved by the present invention.

Figure 9:
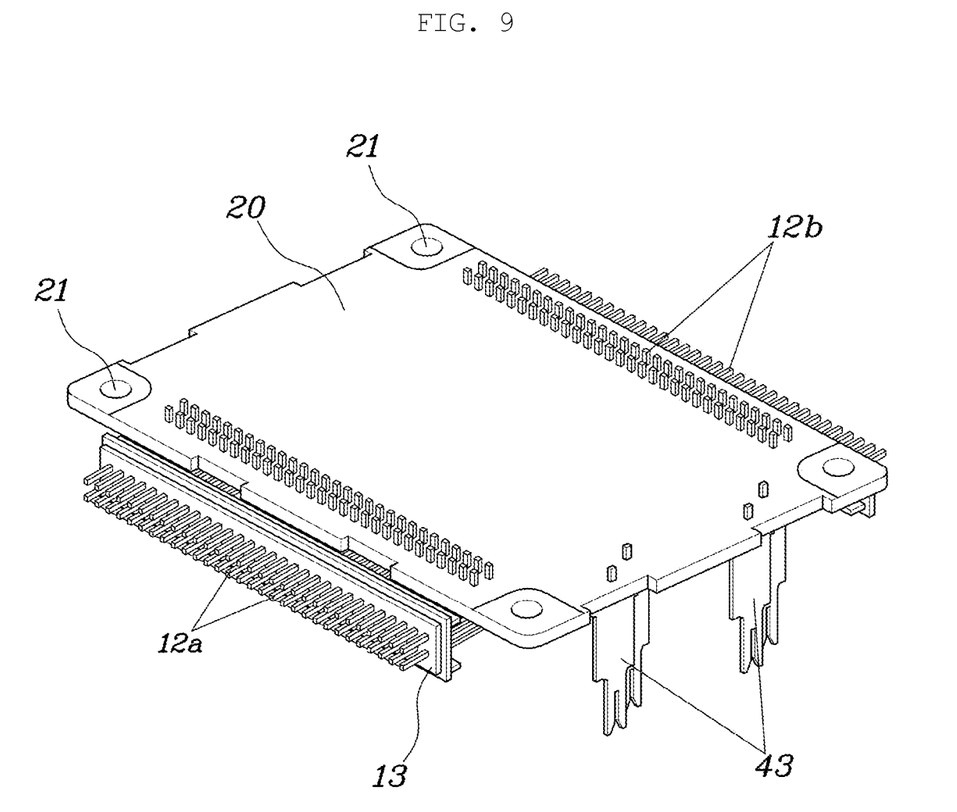
FIGS. 9 and 10 are views showing a configuration in which a terminal pin is coupled to a PCB according to the present invention.
Figure 10:
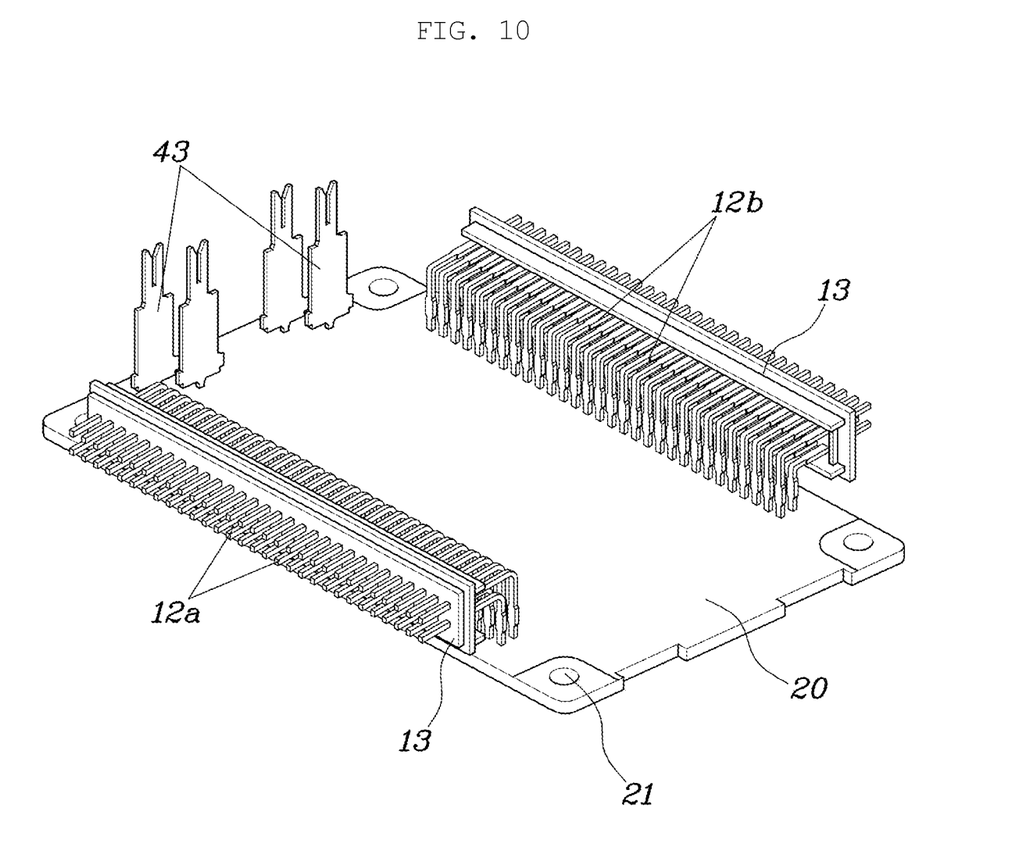

Further, FIGS. 9 and 10 are views showing a configuration in which the terminal pins 12 are coupled to the PCB 20 according to the present invention.

Referring to the drawing, one end of the terminal pin 12 is coupled through in a direction perpendicular to the plane of the PCB 20, and the middle end of the terminal pin 12 is bent toward the fastener of the connector 14. Thus, the other end of the terminal pin 12 is located inside the connector 14.

Specifically, the terminal pin 12 is bent in a shape of 'L', so that the other end of the one terminal pin 12a and the other end of the other terminal pin 12b are provided toward opposite directions away from each other.

That is, the terminal pin 12 is bent in a shape of 'L' while penetrating through the PCB 20, so that the one terminal pin 12a and the other terminal pin 12b are hooked on both sides of the PCB 20. Thus, the one terminal pin 12a and the other terminal pin 12b act with the same force on both sides of the PCB 20 so that the force is balanced in the left and right directions and in the vertical direction.

Figure 11:
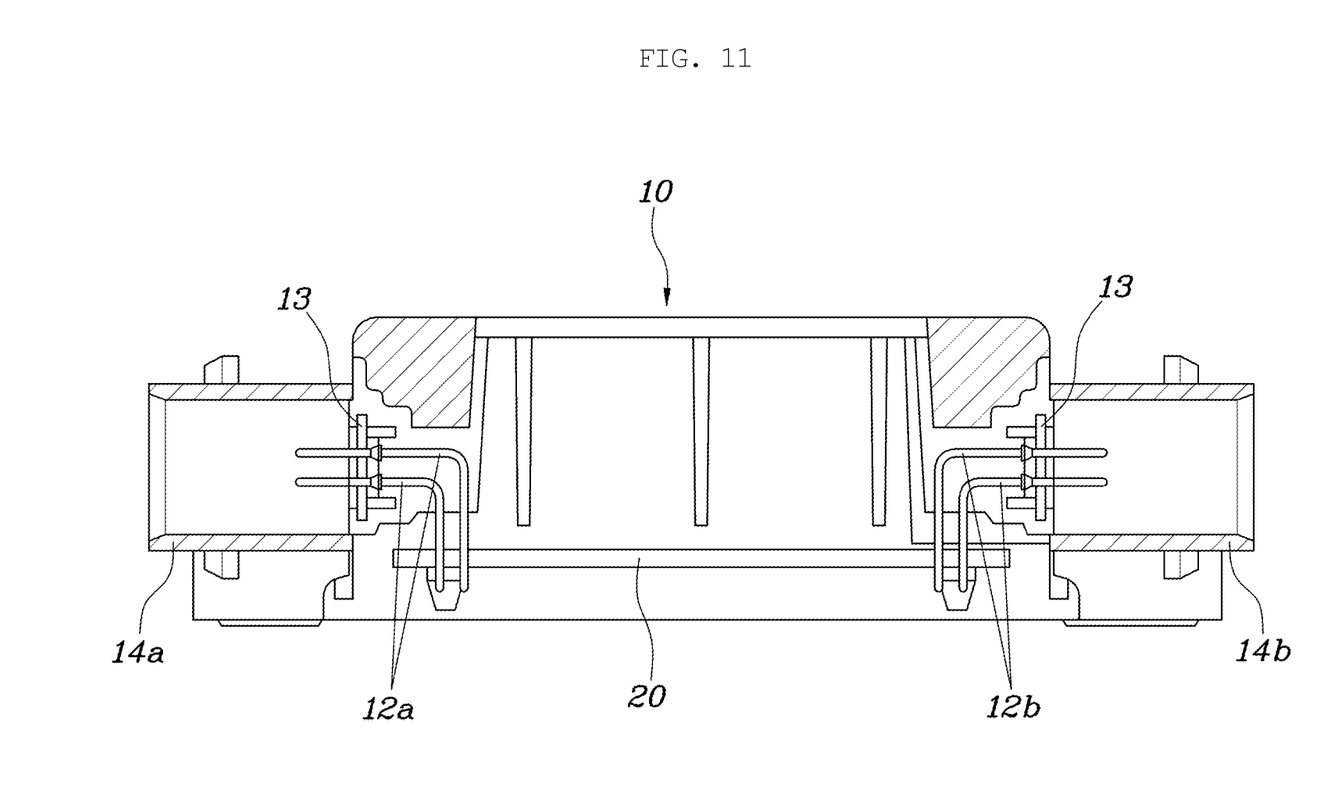
FIG. 11 is a view showing a configuration in which a pin alignment bracket having a terminal pin is fixed to an inside of a housing according to the present invention.

Further, FIG. 11 is a view showing a configuration in which a pin alignment bracket 13 having the terminal pin 12 is fixed inside the housing 10 according to the present invention.

Referring to the drawing, the terminal pins 12 are arranged in a plurality of rows and penetrated the pin alignment bracket 13 in a plate shape, and the pin alignment bracket 13 is fixed to the inner surface of the housing 10. Thus, in the process of coupling the PCB 20 to the housing 10, the terminal pin 12 is inserted and coupled to the terminal pin hole 22 formed in the PCB 20.

For example, a plurality of terminal pins 12 is provided in two rows on the pin alignment bracket 13, and the terminal pins 12 in a horizontal state penetrate the pin alignment bracket 13 and then are formed to be bent. Accordingly, the terminal pins 12 are aligned in advance with the pin alignment bracket 13.

Accordingly, the pin alignment bracket 13 in which the terminal pins 12 are aligned is fixed to the inner surface of the housing 10, and the terminal pin 12 is positioned so as to correspond to the terminal pin hole 22 formed in the PCB 20. As a result, when coupled to the PCB 20, the terminal pin 12 is inserted into and coupled to the terminal pin hole 22.

That is, by fixing the terminal pin 12 to the housing 10 in a state in which the terminal pin 12 is aligned with the pin alignment bracket 13, not only can the terminal pin 12 be aligned, but also the terminal pin 12 can be easily coupled to the terminal pin hole 22.

Figure 4:
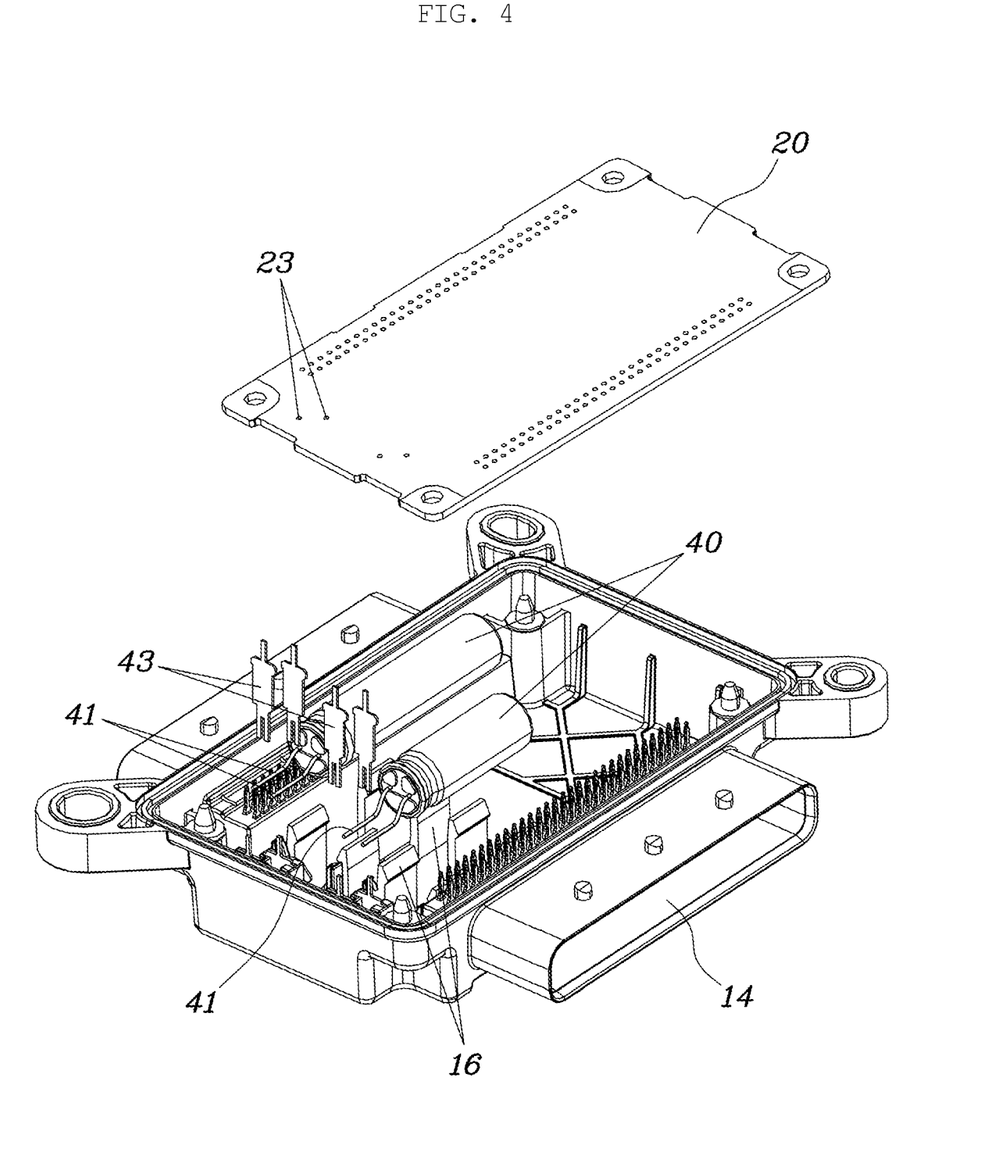
FIG. 4 is a view explaining a configuration in which a capacitor is coupled to a PCB inside a housing according to the present invention.
Figure 5:
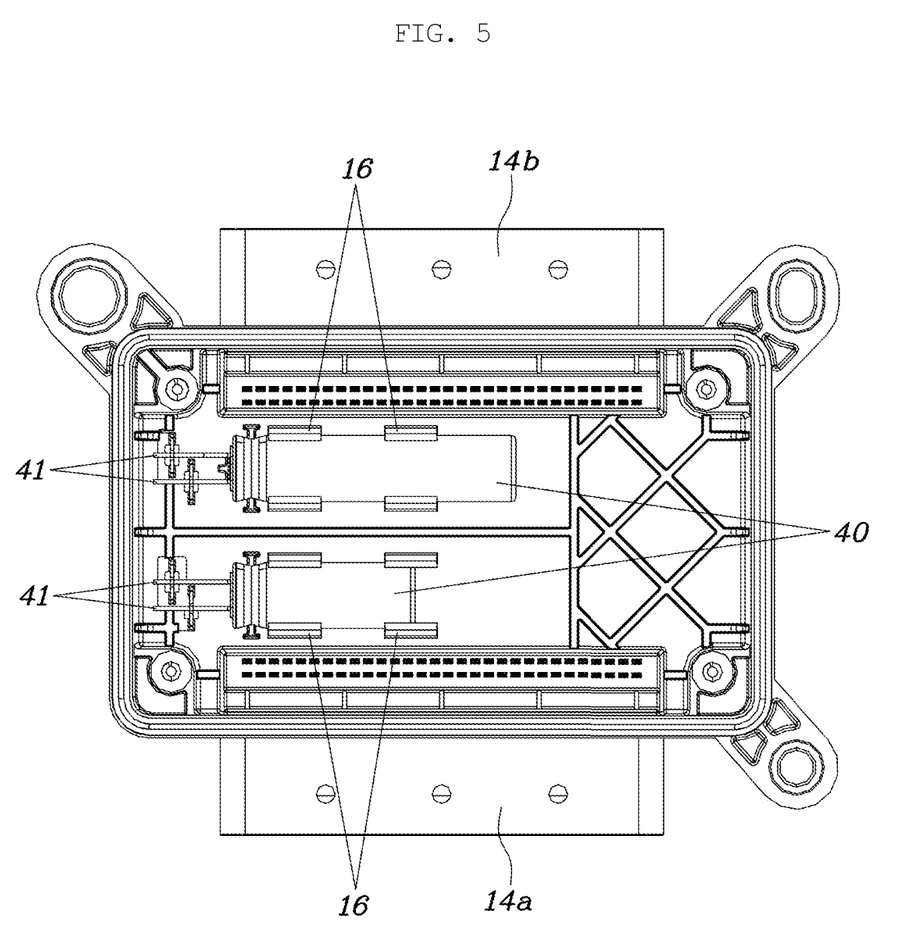
FIG. 5 is a view showing a state in which a capacitor is seated and fastened inside a housing according to the present invention.

On the other hand, FIG. 4 is a view explaining a configuration in which a capacitor 40 is coupled to the PCB 20 inside the housing 10 according to the present invention, and FIG. 5 is a view showing a state in which the capacitor 40 is seated and fastened inside the housing according to the present invention.

Referring to the drawings, the capacitor 40 in a cylindrical shape is provided on the inner bottom of the housing 10 in a form in which the capacitor is laid down along the length direction of the longer side.

In addition, hooks 16 are formed on the bottom surface of the housing 10 in a shape that surrounds a portion of both sides of the outer circumferential surface of the capacitor 40 so that the capacitor 40 is fastened by the hook 16.

For example, the hook 16 is insert injection-molded into the housing 10. The lower end of the hook 16 is fixed to the bottom surface of the housing 10, and the portion extending from the middle end to the upper end protrudes toward the upper portion of the capacitor, so that it is formed in an arc shape corresponding to the shape of the outer circumferential surface of the capacitor 40. Thus, both outer circumferential surfaces of the capacitor 40 are pressed and fastened.

That is, since the capacitor 40 is fastened in a state lying on the bottom surface of the housing 10, the height of the capacitor 40 is reduced to reduce the height of the housing 10, thereby making it possible to implement a slim airbag control unit.

In addition, the capacitor 40 and the PCB 20 are connected to be energized by a lead pin 41 and a holder pin 43.

Specifically, one end of the lead pin 41 is connected to the end of the capacitor 40 so as to be energized. In addition, the holder pin 43 is connected to be energized between the other end of the lead pin 41 and the PCB 20.

That is, the upper end of the holder pin 43 is coupled to be energized to the PCB 20, and the lower end of the holder pin 43 is coupled to be energized to the lead pin 41, so that the capacitor 40 and the PCB 20 can be electrically connected.

Figure 6:
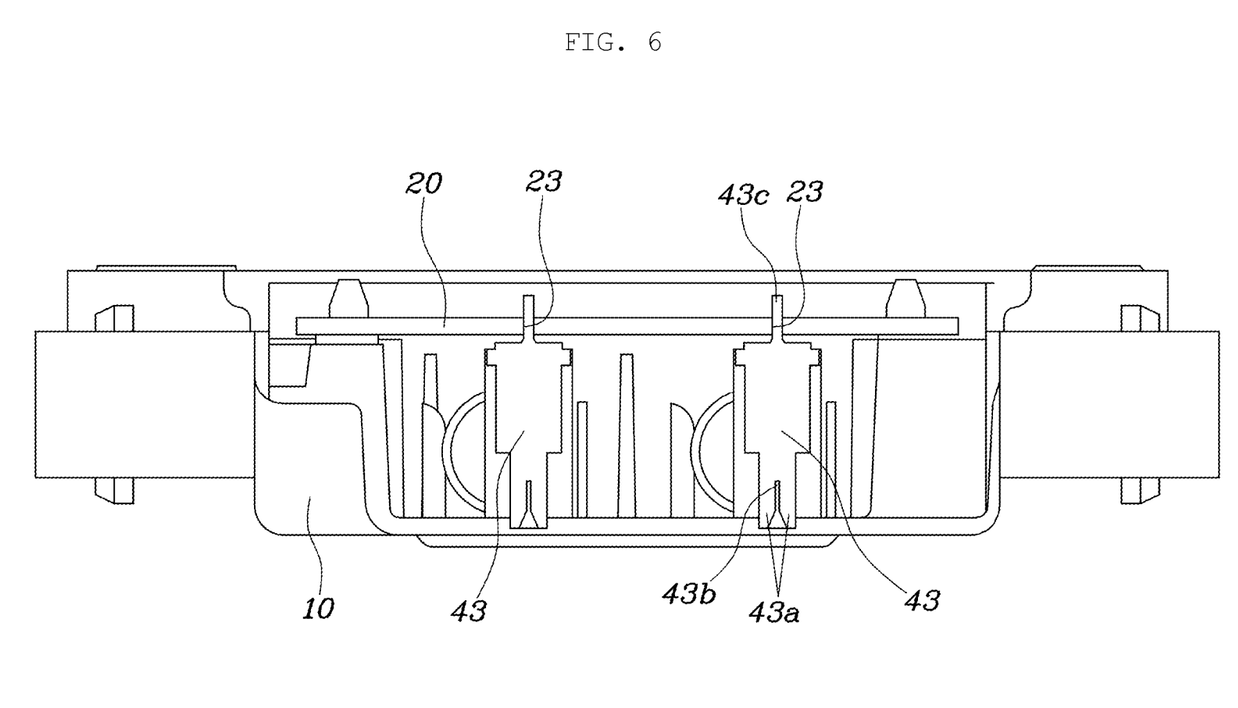
FIG. 6 is a view explaining a configuration in which a housing and a PCB are connected to be energized by a holder pin according to the present invention.

FIG. 6 is a view explaining a configuration in which the housing 10 and the PCB 20 are connected to be energized by the holder pin 43 according to the present invention. When described with reference to the drawings, the lower portion of the holder pin 43 is split into a V shape, and pin legs 43*a* are formed on both sides. The lower end of the pin leg 43*a* is seated and coupled to the bottom surface of the housing 10.

In addition, a lead pin groove 43*b* is formed between the pin legs 43*a* of the both sides by the split V shape, so that the lead pin 41 is inserted in the lead pin groove 43*b* so as to be energized.

In addition, a pin head 43*c* is formed to protrude on the upper portion of the holder pin 43, and a holder pin hole 23 is formed on the PCB 20 corresponding to the pin head 43*c*, so that the pin head 43*c* is coupled in the holder pin hole 23 to be energized.

That is, conventionally, the PCB 20 and the capacitor 40 were connected by a soldering method or the like, but in the present invention, when the PCB 20 is coupled into the housing 10, the capacitor 40 and the PCB 20 are electrically connected by the lead pin 41 and the holder pin 43 to complete a wiring, so that the electrical connection structure is easily and conveniently implemented.

As described above, in the present invention, the housing and the PCB 20 are coupled in a double fixing method by the terminal pin 12 and welding joint, and the housing and the cover 30 of a plastic material are integrated and combined by welding joint. Thus, the present invention can manufacture the control unit slim, realize excellent waterproof performance, and reduce the cost and weight by the reducing the parts for control unit coupling.

Further, the connectors are arranged in both directions of the housing, and the terminal pins are coupled to the positions of the PCB facing each connector, thereby preventing the wire branching from the airbag control unit from being bent.

Still further, since the wiring harness structure is optimized, the force applied to the airbag control unit is distributed to prevent the load from being concentrated on the airbag control unit. Thus, excessive stress is not applied to the airbag control unit and internal sensors, so that sensing function can be stabilized.

On the other hand, the present invention has been described in detail only for the above specific examples, but it is obvious to those skilled in the art that various modifications and modifications are possible within the scope of the technical idea of the present invention, and it is rightful that such modifications and modifications belong to the appended claims.

What is claimed is:

1. An airbag control unit comprising:
a housing having an internal storage space, a terminal pin disposed at the internal storage space, and an opening exposing the internal storage space;
a PCB disposed at the internal storage space of the housing and having a terminal pin hole engaged with the terminal pin of the housing; and
a cover configured to cover the opening and having an edge joined along an edge of the opening of the housing,
wherein the housing includes a coupling protrusion disposed at a corner of the internal storage space of the housing extending toward the opening of the housing,
wherein the PCB has a through-hole disposed corresponding to the coupling protrusion at a corner of the PCB, the coupling protrusion of the housing extending through the through-hole of the PCB, and
wherein the cover includes a boss disposed corresponding to the coupling protrusion at a corner of the cover, the coupling protrusion having an end portion coupled to the boss of the cover.

2. The airbag control unit of claim 1, wherein:
the housing and the cover comprise a plastic material, and
the coupling protrusion and the boss are laser-welded to each other.

3. The airbag control unit according to claim 1, wherein:
the housing and the cover comprise a plastic material, and
the edge of the opening and the edge of the cover are laser-welded to each other.

4. An airbag control unit comprising
a housing having an internal storage space and an opening exposing the internal storage space;
a PCB coupled to the housing at a corner portion of the opening and having an electrical connection structure in which a terminal pin is inserted into a terminal pin hole for receiving power; and
a cover on the opening with an edge thereof joined along an edge of the opening,
wherein first and second connectors are located respectively on opposite sides of the housing, the PCB is located inside the housing, and first and second terminal pins, respectively, are coupled to opposite sides of the PCB facing the first and second connectors, and
wherein the first and second terminal pins are symmetrically coupled respectively to the opposite sides of the PCB based on a virtual center line formed along a center of the PCB.

5. The airbag control unit of claim 4, wherein the first and second terminal pins are disposed respectively along opposite inside edges of the housing.

6. The airbag control unit of claim 4, wherein the first and second terminal pins are disposed symmetrically within, and along opposite edges of, the housing.

7. The airbag control unit according to claim 4, further comprising a sensor unit disposed between the first and second terminal pins.

8. An airbag control unit comprising:
a housing having an internal storage space and an opening exposing the internal storage space
a PCB coupled to the housing at a corner portion of the opening and having an electrical connection structure in which a terminal pin is inserted into a terminal pin hole for receiving power; and
a cover on the opening with an edge thereof joined along an edge of the opening,
wherein one end of the terminal pin penetrates, and is coupled in a direction perpendicular to, a plane of the PCB; a middle portion of the terminal pin is bent toward a fastener of the connector, and the other end of the terminal pin is located inside the connector.

9. The airbag control unit of claim 8, wherein the terminal pin is configured in a shape of 'L' and the other end of one terminal pin and the other end of the other terminal pin are provided in mutually opposite directions.

10. The airbag control unit of claim 8, wherein the terminal pins are arranged in a plurality of rows and penetrate a pin alignment bracket in a plate shape; the pin alignment bracket is fixed to an inner surface of the housing, and the terminal pin is within and coupled to the terminal pin hole formed on the PCB such that the PCB is coupled to the housing.

11. An airbag control unit comprising:
a housing having an internal storage space and an opening exposing the internal storage space
a PCB coupled to the housing at a corner portion of the opening and having an electrical connection structure in which a terminal pin is inserted into a terminal pin hole for receiving power; and
a cover on the opening with an edge thereof joined along an edge of the opening,
wherein a cylindrical capacitor is inside the housing, a hook is formed on a bottom surface of the housing to be surrounding an outer circumferential surface of the capacitor, and the capacitor is fastened by the hook, and
wherein a lead pin is connected to be energized from one end of the capacitor; and a holder pin is connected to be energized between the lead pin and the PCB.

12. The airbag control unit of claim 11, wherein a lower portion of the holder pin is divided into a V shape to form a pin leg, and an end of the pin leg is coupled to the bottom surface of the housing; a lead pin groove is formed between the pin legs so that the lead pin is inserted so as to be energized; a pin head is formed protruding on an upper portion of the holder pin; and a holder pin hole is formed on the PCB corresponding to the pin head so that the pin head is connected to be energized.

* * * * *